US007547661B2

(12) United States Patent
Driscoll et al.

(10) Patent No.: US 7,547,661 B2
(45) Date of Patent: Jun. 16, 2009

(54) ENHANCED PINNING IN MIXED RARE EARTH-123 FILMS

(75) Inventors: Judith L. Driscoll, Los Alamos, NM (US); Stephen R. Foltyn, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 797 days.

(21) Appl. No.: 10/925,479

(22) Filed: Aug. 25, 2004

(65) Prior Publication Data
US 2006/0073974 A1   Apr. 6, 2006

(51) Int. Cl.
H01L 39/00 (2006.01)
H01L 39/24 (2006.01)
H01F 6/00 (2006.01)
H01B 12/00 (2006.01)

(52) U.S. Cl. .................. 505/238; 505/779; 505/701; 505/191; 505/237; 428/699; 428/701; 428/702; 365/161

(58) Field of Classification Search .......... 505/100, 505/230, 235–239, 470, 472, 473–475; 428/469, 428/472, 629, 633; 427/62, 126.3; 117/84, 117/9; 29/599
See application file for complete search history.

(56) References Cited

U.S. PATENT DOCUMENTS

| | | | | |
|---|---|---|---|---|
| 4,861,751 A | * | 8/1989 | Tenhover | 505/434 |
| 5,104,849 A | * | 4/1992 | Shiga et al. | 505/231 |
| 2005/0159298 A1 | * | 7/2005 | Rupich et al. | 502/100 |

OTHER PUBLICATIONS

Murugesan et al, "Growth and Characterization of PLD Grown Dy0.4Ho0.6Ba2Cu3Oy thin films", Physica C, 2004, 411,pp. 72-76.*
Environmentalchemistry.com, www.environmentalchemistry.com/yogi/periodic/ionicradius.html, 2008, pp. 1-3.*
Obara et al, "Transport properties of pulsed laser deposition grown Dy0.4Ho0.6Ba2Cu3Oz", Superconductor Science and Technology, 2004, 17(7), 917-941(5), Abstract.*
Muralidhar et al., "Effect of Eu/Gd ratio on Flux Pinning in (nd, Eu, Gd)-Ba-Cu-O," Supercond. Sci. Technol. 13 (2000) 1315-1321.
Devi et al., "Enhanced Critical Current Density Due to Flux Pinning from Lattice Defects in Pulsed Laser Ablated $Y_{1-x}Dy_xBa_2Cu_3O_{7-\partial}$ Thin Films," Supercond. Sci. Technol. 13 (2000) 935-939.
Li et al., "Stress-field Pinning Induce by the Lattice Mismatch in 123 Phase," Physica C 351 (2001) 1-4.
Muralidhar et al., "Pinning Characteristics in Chemically Modified (Nd, Eu, Gd)-Ba-Cu-O Superconductors," Applied Physics Letters, vol. 82 No. 6, Feb. 10, 2003.

* cited by examiner

Primary Examiner—Stanley Silverman
Assistant Examiner—Kallambella Vijayakumar
(74) Attorney, Agent, or Firm—Bruce H. Cottrell

(57) ABSTRACT

An superconductive article and method of forming such an article is disclosed, the article including a substrate and a layer of a rare earth barium cuprate film upon the substrate, the rare earth barium cuprate film including two or more rare earth metals capable of yielding a superconductive composition where ion size variance between the two or more rare earth metals is characterized as greater than zero and less than about $10 \times 10^{-4}$, and the rare earth barium cuprate film including two or more rare earth metals is further characterized as having an enhanced critical current density in comparison to a standard $YBa_2Cu_3O_y$ composition under identical testing conditions.

7 Claims, 4 Drawing Sheets

ENHANCED PINNING IN MIXED RARE EARTH-123 FILMS

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates to high temperature superconducting thick films on polycrystalline substrates with high $J_c$'s and $I_c$'s and to structural template articles for subsequent deposition of an oriented film, e.g., of superconducting thick films.

BACKGROUND OF THE INVENTION

In order to improve the performance and lower the cost/performance ratio of superconducting coated conductors, an important goal is to increase the critical current density ($J_c$) in magnetic fields (H). In bulk melt processed materials, microstructural modification in ternary $REBa_2Cu_3O_{7-x}$ films (hereafter referred to as RE-123 where RE is a rare earth metal) has been shown to increase the irreversibility field. In films, there is already much pinning associated with the growth process and hence improved performance through microstructural modification is nontrivial.

There have been numerous studies of RE-123 films. Advantages of the RE's over yttrium (Y) include lower processing temperatures and wider processing windows (for the RE's smaller than Y), and the possibility for introducing point defects arising from cation exchange between the RE and barium (Ba). However, so far, there has been no clear demonstration of enhanced pinning in RE-123 films compared to high-quality $YBa_2Cu_3O_{7-x}$ (YBCO). It is noted, however, that one very recent report of a ternary RE-123 composition has indicated an improved irreversibility field in about 100 nm thick films on single crystals compared to single component RE-123's. The determination of whether there are any real improvements in pinning when comparing different RE-123 samples is obscured by the different critical temperatures ($T_c$'s), unknown amounts of cation exchange, and different levels of crystallinity associated with the different optimum growth temperatures.

It is an object of the present invention to provide mixed rare earth barium cuprate compositions where there is a low ion size variance of the rare earth ions.

It is another object of the present invention to provide mixed rare earth barium cuprate compositions with a low ion size variance of the rare earth ions, the compositions yielding higher $J_c$'s in comparison to a conventional YBCO under similar conditions.

SUMMARY OF THE INVENTION

To achieve the foregoing and other objects, and in accordance with the purposes of the present invention, as embodied and broadly described herein, the present invention provides a thin film superconductive article including a substrate, and, a thick film layer of a rare earth barium cuprate film upon the substrate, the rare earth barium cuprate film having a thickness of greater than about 600 nm and including two or more rare earth metals capable of yielding a superconductive $REBa_2Cu_3O_y$ composition where ion size variance between the two or more rare earth metals is characterized as greater than zero and less than about $10 \times 10^{-4}$, wherein the rare earth barium cuprate film including two or more rare earth metals is further characterized as having an enhanced critical current density in comparison to a standard $YBa_2Cu_3O_y$ composition under identical testing conditions.

In another embodiment of the invention, the present invention provides a thin film superconductive article including a substrate, and, a thick film layer of a rare earth barium cuprate film upon the substrate, the rare earth barium cuprate film including two or more rare earth metals capable of yielding a superconductive $REBa_2Cu_3O_y$ composition where ion size variance between the two or more rare earth metals is characterized as greater than zero and less than about $0.5 \times 10^{-4}$, wherein the rare earth barium cuprate film including two or more rare earth metals is further characterized as having an enhanced critical current density in comparison to a standard $YBa_2Cu_3O_y$ composition under identical testing conditions.

The present invention also provides a method of increasing flux pinning and critical current density in a thick film layer of rare earth barium cuprate film including depositing a layer of greater than about 600 nm having a composition of a rare earth barium cuprate film including two or more rare earth metals capable of yielding a superconductive $REBa_2Cu_3O_y$ composition where ion size variance between the two or more rare earth metals is characterized as greater than zero and less than about $10 \times 10^{-4}$ onto a substrate, wherein the rare earth barium cuprate film including two or more rare earth metals is further characterized as having an enhanced critical current density in comparison to a standard $YBa_2Cu_3O_y$ composition under identical testing conditions.

DETAILED DESCRIPTION

Figure 1:
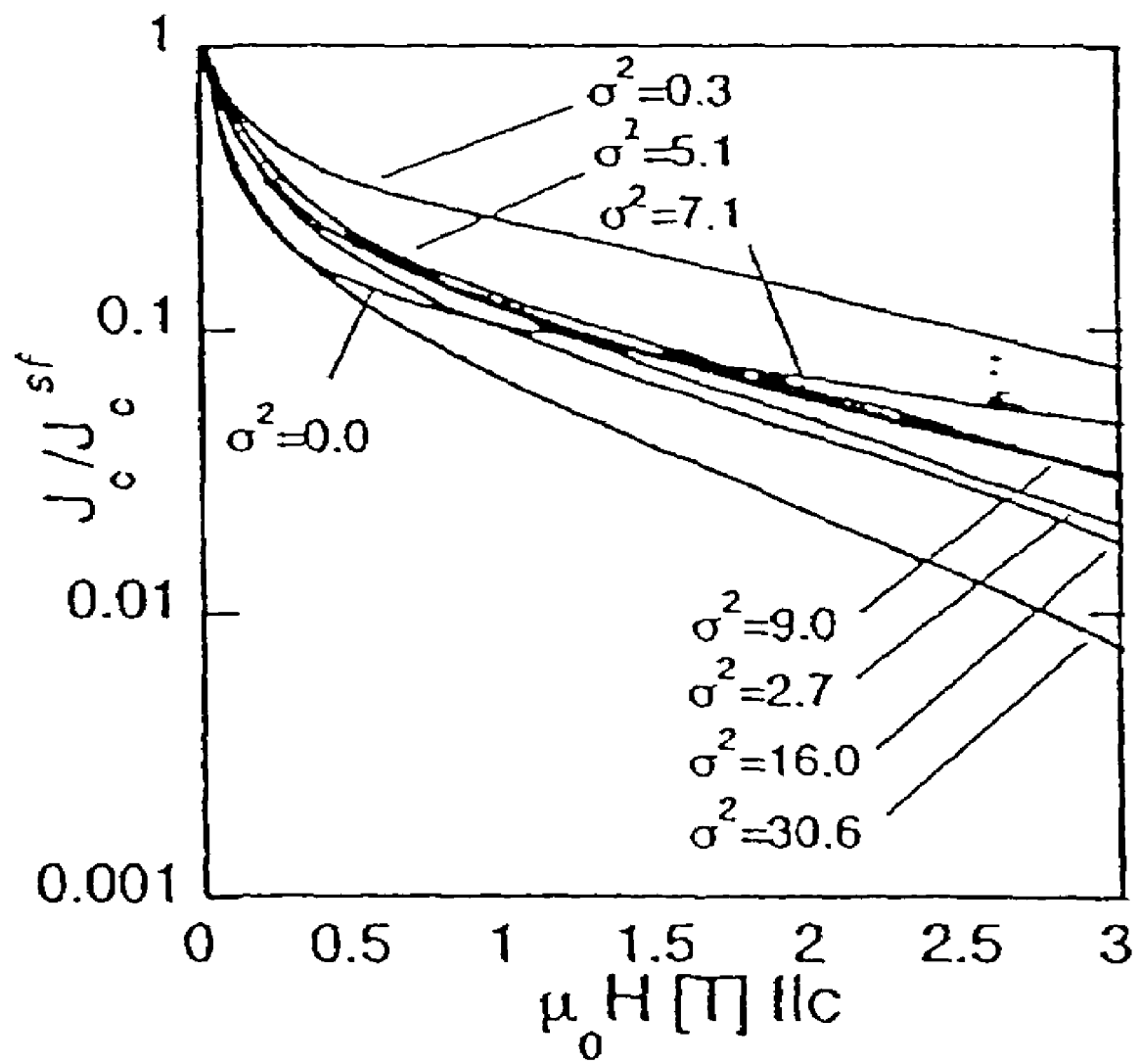
FIG. 1 shows a graph of $J_c$ normalized by $J_c^{sf}$(75.5 K) as a function of magnetic field to 3 Tesla applied parallel to the film c axis for a series of ion size variance films on single crystal $SrTiO_3$. The variance ($\sigma^2 \times 10^4$) is shown as a parameter on the graph.

The present invention is concerned with high temperature mixed rare earth superconductive thin films having enhanced in-field critical current density in comparison to YBCO films under similar conditions. Such enhancement in in-field critical current density is highly reproducible and involves careful control of the rare-earth ion size variance in the mixed rare earth superconductive thin films.

In the present invention, the high temperature superconducting (HTS) material is generally YBCO, e.g., $YBa_2Cu_3O_{7-\delta}$, $Y_2Ba_4Cu_7O_{14+x}$, or $YBa_2Cu_4O_8$, although other minor variations of this basic superconducting material, such as use of other rare earth metals such as, e.g., erbium, samarium, neodymium, europium, gadolinium, holmium, ytterbium, or dysprosium, as a substitute for some or all of the yttrium as is well known, may also be used. Other superconducting materials such as bismuth and thallium based superconductor materials may also be employed. $YBa_2Cu_3O_{7-\delta}$ is preferred as the superconducting material. In addition, mixtures of superconducting materials may be used and multilayers of the same or differing superconducting materials may be used.

The thin films of high temperature superconducting materials are generally from about 0.2 microns (200 nanometers (nm)) to about 5 microns (2000 nm) in thickness, more preferably in the range of from about 0.6 μm (600 nm) to about 4 μm (2000 nm). Thicker film than 4 to 5 μm may be formed in some instances if desired.

Among the various rare earth metals suitable in forming the high temperature superconducting (HTS) compositions (RE-$Ba_2Cu_3O_7$ or RE-BCO) of the present invention can be any of the rare earth elements (e.g., $RE^1$ and $RE^2$) from the group of yttrium, neodymium, promethium, samarium, europium, gadolinium, terbium, dysprosium, holmium, erbium, thulium, ytterbium, and lutetium. Binary combinations of the rare earth elements may include yttrium and neodymium, yttrium and promethium, yttrium and samarium, yttrium and europium, yttrium and gadolinium, yttrium and terbium, yttrium and dysprosium, yttrium and holmium, yttrium and erbium, yttrium and thulium, yttrium and ytterbium, yttrium and lutetium, neodymium and promethium, neodymium and samarium, neodymium and europium, neodymium and gadolinium, neodymium and terbium, neodymium and dysprosium, neodymium and holmium, neodymium and erbium, neodymium and thulium, neodymium and ytterbium, neodymium and lutetium, promethium and samarium, promethium and europium, promethium and gadolinium, promethium and terbium, promethium and dysprosium, promethium and holmium, promethium and erbium, promethium and thulium, promethium and ytterbium, promethium and lutetium, samarium and europium, samarium and gadolinium, samarium and terbium, samarium and dysprosium, samarium and holmium, samarium and erbium, samarium and thulium, samarium and ytterbium, samarium and lutetium, europium and gadolinium, europium and terbium, europium and dysprosium, europium and holmium, europium and erbium, europium and thulium, europium and ytterbium, europium and lutetium, gadolinium and terbium, gadolinium and dysprosium, gadolinium and holmium, gadolinium and erbium, gadolinium and thulium, gadolinium and ytterbium, gadolinium and lutetium, terbium and dysprosium, terbium and holmium, terbium and erbium, terbium and thulium, terbium and ytterbium, terbium and lutetium, dysprosium and holmium, dysprosium and erbium, dysprosium and thulium, dysprosium and ytterbium, dysprosium and lutetium, holmium and erbium, holmium and thulium, holmium and ytterbium, holmium and lutetium, erbium and thulium, erbium and ytterbium, erbium and lutetium, thulium and ytterbium, thulium and lutetium, and ytterbium and lutetium. Ternary combinations can be used as well, e.g., combinations of: yttrium, dysprosium and holmium; yttrium, dysprosium and gadolinium; yttrium, holmium, and erbium; and the like. Also, quaternary combinations may be used as well, e.g., yttrium, dysprosium, erbium and holmium, and the like, as may additional combinations including more than four of the individual rare earth elements.

It is desired to have a low ion size variance between the mixed rare earth metals. Calculation of the rare earth (RE) ion size variance is according to the formula for variance:

$$\sigma^2 = (\Sigma y_i (r_i)^2) - (r_A)^2,$$

where $\sigma^2$ is the variance of the mixture of RE ions, i; $y_i$ is the mole fraction of ion i, and $r_A$ is the mean ionic radius. For example, for a composition of $Dy_{1/3}Ho_{2/3}Ba_2Cu_3O_y$, the variance $\sigma^2$ is $[\frac{1}{3}(1.027^2) + \frac{2}{3}(1.015^2)] - 1.019^2$ or $0.32 \times 10^{-4}$ Å$^2$.

In addition to the ion size variance, control of the mean ionic radius can be a controlled factor. The mean ionic radius of the rare earth metals in the composition can be at about the radius of the yttrium ion, i.e., about 1.019 Angstroms, used in conventional YBCO superconductors, or the mean ionic radius of the rare earth metals in the composition can be either above or below that of yttrium. Generally, when the mean size of the ions increases much above that of yttrium, the result is an increase in the processing temperatures needed in forming the superconductive material. As this can create other problems, it may not be desirable to go much above the mean ion radius of yttrium. Generally, when the mean size of the ions decreases much below that of yttrium, the result is an decrease in the superconductive transition temperature of the resultant composition. So it may not be desirable to go much below the mean ion radius of yttrium.

While it may be generally desirable to maintain the mean ionic radius of the rare earth metals in the composition at about the radius of the yttrium ion, low ion size variances can still be achieved at varying mean ionic radii. For example, for compositions having a mean ionic radius above yttrium, near that of dysprosium, i.e., about 1.027 Angstroms, a composition of $Y_{0.13}Gd_{0.04}Dy_{0.83}Ba_2Cu_3O_y$ with a low ion size variance of $0.35 \times 10^{-4}$ can be formulated. Similarly, compositions having a mean ionic radius below yttrium, near that of holmium, i.e., about 1.015 Angstroms, a composition of $Y_{0.55}Ho_{0.25}Er_{0.2}Ba_2Cu_3O_y$ with a low ion size variance of $0.35 \times 10^{-4}$ or a composition of $Y_{0.73}Er_{0.27}Ba_2Cu_3O_y$ with a low ion size variance of $0.44 \times 10^{-4}$ can be formulated. Various compositions having a mean ionic radius near that of yttrium have been identified and yield a low ion size variance, including, e.g., $Y_{0.2}Dy_{0.42}Ho_{0.24}Er_{0.16}Ba_2Cu_3O_y$ with a low ion size variance of $0.65 \times 10^{-4}$, $Dy_{0.33}Ho_{0.67}Ba_2Cu_3O_y$ with a low ion size variance of $0.32 \times 10^{-4}$, $Dy_{0.81}Yb_{0.19}Ba_2Cu_3O_y$ with a low ion size variance of $2.72 \times 10^{-4}$, $Gd_{0.30}Er_{0.70}Ba_2Cu_3O_y$ with a low ion size variance of $5.10 \times 10^{-4}$, $Eu_{0.24}Er_{0.76}Ba_2Cu_3O_y$ with a low ion size variance of $7.05 \times 10^{-4}$, $Sm_{0.20}Er_{0.80}Ba_2Cu_3O_y$ with a low ion size variance of $9.00 \times 10^{-4}$, and $Y_{0.95}Ho_{0.26}Dy_{0.24}Ba_2Cu_3O_y$ with a low ion size variance of $0.02 \times 10^{-4}$.

In the present invention, the initial or base substrate can be, e.g., any polycrystalline material such as a metal or a ceramic such as polycrystalline aluminum oxide or polycrystalline yttria-stabilized zirconia (YSZ). Preferably, the substrate can be a polycrystalline metal such as a nickel alloy. Suitable nickel alloys can include nickel alloys such as various Hastelloy metals, Haynes metals and Inconel metals. The base substrate may also be a textured metal or metal alloy, e.g., pure nickel, copper, nickel alloy or copper alloy as described by Goyal et al. in U.S. Pat. No. 5,741,377 Substrates from such a textured metal process are generally referred to as rolling assisted biaxially textured substrates (RABiTS). The metal substrate on which the superconducting material is eventually deposited should preferably allow for the resultant article to be flexible whereby superconducting articles (e.g., coils, motors or magnets) can be shaped. As such a metal substrate can have a rough surface, it can be mechanically polished, electrochemically polished or chemically mechanically polished to provide a smoother surface. Alternatively, the desired smoothness for subsequent depositions can be provided by the first coating layer, i.e., an inert oxide material layer.

Surface Profile Scans.

The ion source gas in the ion beam assisted deposition is preferably argon. The ion beam assisted deposition of MgO is conducted with substrate temperatures of generally from about 20° C. to about 100° C. The MgO layer deposited by the IBAD process is generally from about 5 nm to about 20 nm in thickness, preferably about 8 nm to about 15 nm. After deposition of the oriented cubic oxide material having a rock-salt-like structure, e.g., MgO, an additional thin homo-epitaxial layer of the same oriented cubic oxide material, e.g., MgO, can be optionally deposited by a process such as electron beam or magnetron sputter deposition. This thin layer can generally be about 40 nm to 100 nm in thickness. Deposition of the homo-epitaxial layer by such a process can be more readily accomplished than depositing the entire thickness by ion beam assisted deposition.

A high temperature superconducting (HTS) layer, e.g., a mixed rare earth-BCO layer, can be deposited, e.g., by pulsed laser deposition or by methods such as evaporation including coevaporation, e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, molecular beam epitaxy, a sol-gel process, liquid phase epitaxy, a trifluoroacetic acid process or a barium fluoride ($BaF_2$) process and the like.

In pulsed laser deposition, powder of the material to be deposited can be initially pressed into a disk or pellet under high pressure, generally above about 1000 pounds per square inch (PSI) and the pressed disk then sintered in an oxygen atmosphere or an oxygen-containing atmosphere at temperatures of up to 950° C. for at least about 1 hour, preferably from about 12 to about 24 hours. An apparatus suitable for pulsed laser deposition is shown in Appl. Phys. Lett. 56, 578 (1990), "Effects of Beam Parameters on Excimer Laser Deposition of $YBa_2Cu_3O_{7-\delta}$", such description hereby incorporated by reference.

Suitable conditions for pulsed laser deposition include, e.g., the laser, such as an excimer laser (20 nanoseconds (ns), 248 or 308 nanometers (nm)), targeted upon a rotating pellet of the target material at an incident angle of about 45°. The substrate can be mounted upon a heated holder rotated at about 0.5 rpm to minimize thickness variations in the resultant film or coating, The substrate can be heated during deposition at temperatures from about 600° C. to about 950° C., preferably from about 700° C. to about 850° C. An oxygen atmosphere of from about 0.1 millitorr (mTorr) to about 500 mTorr, preferably from about 100 mTorr to about 250 mTorr, can be maintained within the deposition chamber during the deposition. Distance between the substrate and the pellet can be from about 4 centimeters (cm) to about 10 cm.

The deposition rate of the film can be varied from about 0.1 angstrom per second (Å/s) to about 200 Å/s by changing the laser repetition rate from about 0.1 hertz (Hz) to about 200 Hz. Generally, the laser beam focused on the substrate surface can have dimensions of about 3 millimeters (mm) by 4 mm with an average energy density of from about 1 to 4 joules per square centimeter ($J/cm^2$). After deposition, the films generally are cooled within an oxygen atmosphere of greater than about 100 Torr to room temperature.

The present invention is more particularly described in the following examples which are intended as illustrative only, since numerous modifications and variations will be apparent to those skilled in the art.

EXAMPLE 1

Eight targets of different compositions (see Table 1) were prepared. The rare earth (RE) ion size variance was changed according to the formula for variance:

$$\sigma^2 = (\Sigma y_i (r_i)^2) - (r_A)^2,$$

where $\sigma^2$ is the variance of the mixture of RE ions, i; $y_i$ is the mole fraction of ion i, and $r_A$ is the mean ionic radius. For each composition, the mean ionic radius was the size of $Y^{3+}$, i.e. $(r_A)=1.019$.

For each target, appropriate RE-123 commercial starting powders were mixed, ground, pressed, and then sintered at 950° C. in flowing oxygen gas. The targets were ablated using pulsed laser deposition with a KrF excimer laser ($\lambda$=248 nm), at a repetition rate of 10 Hz. All of the depositions were carried out at the same substrate-to-target distance of 5 cm and an oxygen pressure of 200 mTorr. The substrates used were either single crystal $SrTiO_3$ (STO), $SrTiO_3$-buffered MgO single crystals, or $SrTiO_3$-buffered ion beam assisted MgO on Hastelloy substrates, hitherto referred to as ion-beam assisted deposition (IBAD)-MgO. After deposition at 760 to 790° C., samples were cooled to room temperature in $O_2$ at 300 Torr.

Inductive $T_c$ measurements were performed as well as transport $J_c$ measurements on bridges using a four-probe technique and a 1 μV/cm voltage criterion. Angular studies were performed in a 7 T split-coil horizontal magnet, with the sample rotating around a vertical axis and J⊥H (maximum Lorentz force configuration). The measured angle Θ between H and the normal to the films (which coincides with the crystallographic "c" axis) was accurate to better than 0.1°. All $J_c$ measurements were made at the local liquid nitrogen temperature of 75.5 K. Microstructural characterization was carried out by x-ray diffractometry, and transmission electron microscopy (TEM).

Table 1 shows details of the samples prepared in this study. FIG. 1 shows $J_c$ normalized by self-field ($J_c^{sf}$) as a function of magnetic field to 3 T (H∥c), for films on STO. There is little change in $T_c$ or $J_c^{sf}$ across the sample series. However, the highest variance sample ($\sigma^2$=30×10$^{-4}$) has the lowest $T_c$ and $J_c^{sf}$ values. Several $\sigma^2$=0.32×10$^{-4}$ samples of composition $Dy_{1/3}Ho_{2/3}Ba_2Cu_3O_{7-x}$, herein referred to as Dy:Ho, were prepared since this composition showed the optimum performance of $J_c$ in field, particularly at low fields (<0.5 T). Although only one set of $J_c$(H) data is shown in FIG. 1 for Dy:Ho and for YBCO, the data are highly typical of other samples of these compositions. For YBCO ($\sigma^2$=0), the normalized $J_c$ drops by a decade in 1 T. For the optimum variance sample, $J_c$ drops by a decade in >2.5 T.

TABLE 1

Data for Samples prepared with an average RE ionic radius of 1.019 and different RE ion size variance

| Sample No. | RE variance $\sigma^2$ ($\times 10^4$) | RE1:RE2 ratio in (RE$_1$, RE$_2$)BCO) | substrate | $T_c$ (K) | thickness (µm) | $J_c^{sf}$ (75.5 K) (MA/cm$^2$) | $J_c$(0.2 T) (75.5 K) H ∥ c (MA/cm$^2$) | $J_c$(0.2 T)/ $J_c^{sf}$ (75.5 K) |
|---|---|---|---|---|---|---|---|---|
| Samples on single crystal substrates (SrTiO$_3$ or SrTiO$_3$-buffered MgO) | | | | | | | | |
| 26 | 0.00 | Y = 1 | STO | 91.7 | 1.55 | 2.3 | 0.7 | 0.24 |
| 18 | 0.32 | Dy:Ho = 1:2 | STO | 89.0 | 1.50 | 1.7 | 0.9 | 0.52 |
| 32 | 0.32 | Dy:Ho = 1:2 | STO | 89.5 | 1.40 | 2.5 | 1.3 | 0.49 |
| 84 | 0.32 | Dy:Ho = 1:2 | STO/MgO | 91.8 | 1.20 | 2.6 | 1.4 | 0.52 |
| 92 | 0.32 | Dy:Ho = 1:2 | STO/MgO | 93.0 | — | — | — | — |
| 17 | 2.72 | Dy:Yb = 1:0.24 | STO | 89.0 | 1.60 | 1.9 | 0.8 | 0.41 |
| 16 | 5.10 | Gd:Er = 1:2.27 | STO | 91.0 | 1.75 | 2.3 | 0.9 | 0.40 |
| 27 | 7.05 | Eu:Er = 1:3.13 | STO | 90.8 | 1.95 | 1.8 | 0.6 | 0.36 |
| 19 | 9.00 | Sm:Er = 1:4 | STO | 89.8 | 1.70 | 2.1 | 0.8 | 0.35 |
| 15 | 15.98 | Eu:Yb = 1:1.38 | STO | 88.5 | 1.20 | 2.0 | 0.7 | 0.34 |
| 14 | 30.58 | Nd:Yb = 1:2.65 | STO | 87.0 | 0.70 | 1.8 | 0.4 | 0.25 |
| Samples on SrTiO$_3$-buffered IBAD MgO | | | | | | | | |
| 871 | 0.00 | Y = 1 | IBAD | 92.1 | 1.20 | 2.3 | 0.7 | 0.32 |
| 841 | 0.32 | Dy:Ho = 1:2 | IBAD | 91.0 | 1.20 | >2.1 | — | — |
| 921 | 0.32 | Dy:Ho = 1:2 | IBAD | 92.0 | 1.00 | 3.3 | 1.5 | 0.46 |

Figure 2:
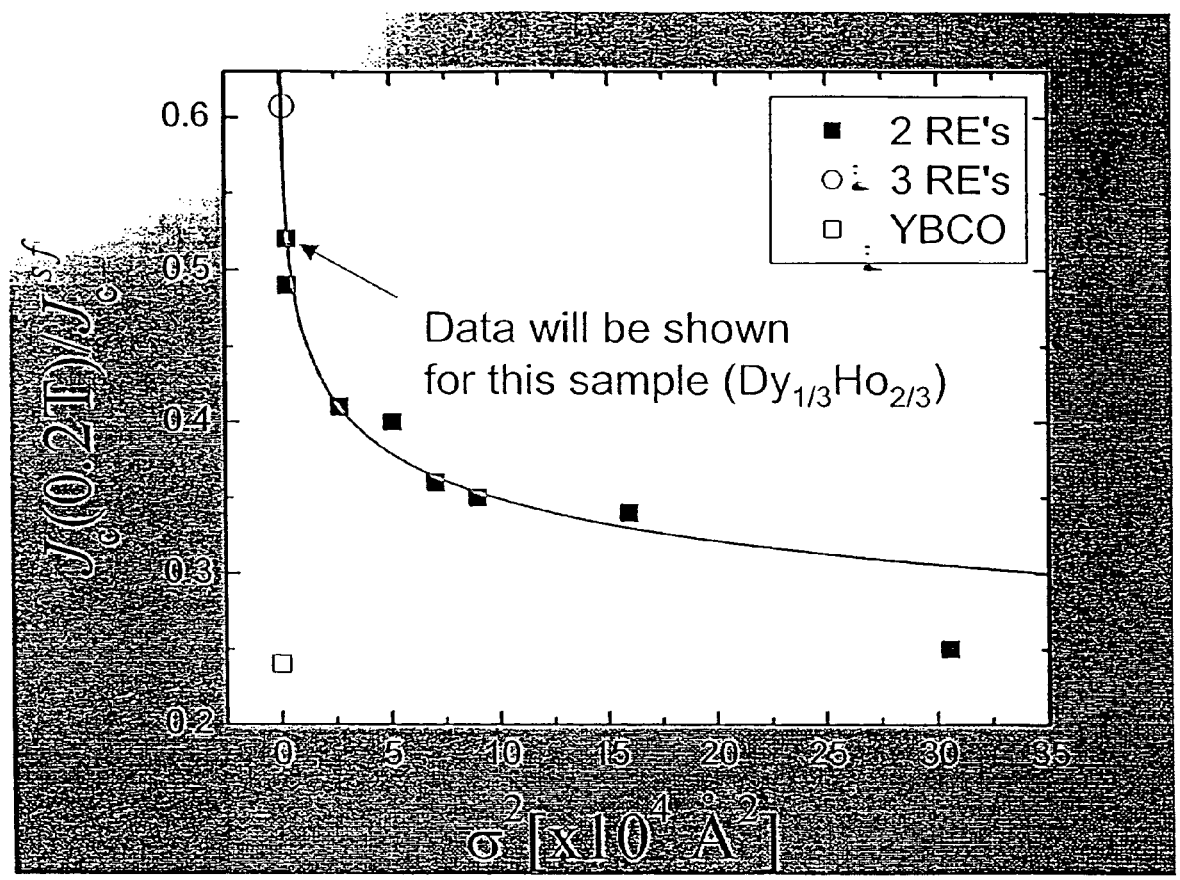
FIG. 2 shows a graph of $J_c$ normalized by $J_c^{sf}$(75.5 K) at 0.2 Tesla as a function of RE ion size variance. A YBCO sample (zero variance) is shown as an open circle and the nonzero variance samples are shown as closed circles.

FIG. 2 shows $J_c$(0.2 T)/$J_c^{sf}$ versus variance. For the samples with nonzero variance, there is a systematic trend of decrease in normalized $J_c$ with variance. Despite the high $T_c$ of the YBCO sample, it has the poorest low field ($\mu_0 H < 0.3$ T) behavior of all the samples. Table 1 shows excellent reproducibility of the $J_c$(0.2 T)/$J_c^{sf}$ values for the four $\sigma^2 = 0.32$ samples (three on single crystal substrates and one on IBAD-MgO), with values of about 0.5. The $J_c$(0.2 T)/$J_c^{sf}$ values for YBCO are highly typical of other YBCO samples made in the same laboratory. Hence, at 0.2 T, for YBCO $J_c$ normally drops by a factor of about 4, whereas for Dy:Ho, it drops by a factor of about 2. While the data in Table 1 is shown for 0.2 T, improved $J_c$'s are also found at much higher fields.

Figure 3:
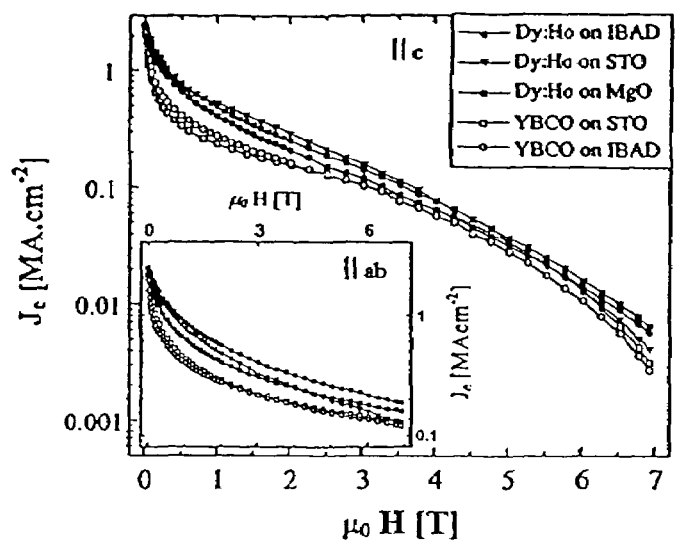
FIG. 3 shows a graph of $J_c$ (75.5 K) as a function of magnetic field to 7 Tesla comparing Dy:Ho with YBCO grown on different substrates. The field is applied parallel to the film c axis. The inset shows $J_c$ for field applied parallel to ab.

FIG. 3 shows $J_c$ as a function of magnetic field to 7 T (H∥c) and the inset shows $J_c$ for H∥ab. YBCO films (sample 26 and sample 871) are compared to Dy:Ho on STO (sample 32), STO/MgO (sample 84), and IBAD (sample 921). For both field orientations, the $J_c$'s of the YBCO films are almost coincident regardless of the substrate used. For all of the Dy:Ho samples, the curves are very close at low fields ($\mu_0 H < 0.5$ T) and over the whole field range are improved with respect to YBCO. For H∥ab, the Dy:Ho samples again show improved performance over YBCO, the one on IBAD-MgO being the best.

Figure 4:
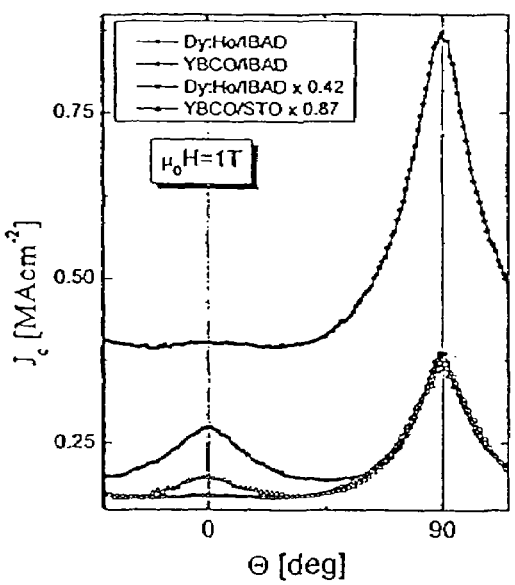
FIG. 4 shows a graph of $J_c$ as a function of $\Theta$ for $\mu_oH=1$ T at 75.5 K for $Dy_{1/3}Ho_{2/3}BCO$ and YBCO on IBAD substrates. For comparison, the same Dy:Ho data are multiplied by 0.42 and YBCO on STO by 0.87. The field is parellel to the c axis and perdendicular to the film plane at $\Theta=0°$.

FIG. 4 shows the angular variation at $\mu_0 H = 1$ T of sample 871 and sample 921 (YBCO and Dy:Ho on IBAD-MgO, respectively), as well as YBCO on STO (sample 26). The Dy:Ho sample has the highest $J_c$ in all field directions. In order to elucidate the origin of the enhanced $J_c$ of Dy:Ho, the Dy:Ho on IBAD-MgO, and YBCO on STO data are normalized to the ab plane peak at $\Theta = 90°$ by multiplying them by 0.42 and 0.87, respectively. From this normalization, there are two major observations. (1) The near absence of a c-axis peak ($\Theta = 0°$) for Dy:Ho, which signals a significant reduction of the c-axis correlated defects. This can be explained by the more laminar growth morphologies of the RE-123's compared to YBCO; and, (2) the collapse of the $J_c(\Theta)$ data outside the c-axis peak region (at $\Theta > 25°$ for YBCO on STO and Dy:Ho on IBAD-MgO and $\Theta > 50°$ for YBCO on IBAD-MgO) This indicates a shared pinning origin. In a recent publication, Civale et al., Appl. Phys. Lett., v. 84, pp. 2121-2123 (2003), have shown that the behavior of FIG. 4 corresponds to the effect of anisotropy with random disorder pinning. Hence, the enhanced pinning observed for the variance series is consistent with pinning by random pointlike disorder, namely random displacements of oxygen ions which result from ion size variance. Cross-sectional TEM of Dy:Ho/STO/MgO (sample 92) high density of ab planar defect in the form of stacking faults as well as some buckling of the ab planes. It is presently unclear whether the faults originate as a result of the variance-inducing ion displacements, or whether they are simply intrinsic to the more laminar growth morphology characteristic of RE-123's. In any case, the regions around the terminations of the faults could act as pointlike defect pinning centers in addition to the random oxygen ion displacement defects.

In other work (MacManus-Driscoll et al., Nat. Mater., v. 3, no. 7, p. 439-443, (2004)) improvements in pinning in >1 µm films of YBCO have been shown through the introduction of BaZrO$_3$ nanoparticles within the film. These heteroepitaxial second phases induced additional edge dislocations along the c-axis direction in the films and corresponding intense broad c-axis peaks. Here, similar levels of pinning enhancement have been demonstrated but through a different mechanism. The possibility exists to combine the use of low variance mixed RE samples with BaZrO$_3$ nanoparticles to further improve pinning.

Figure 5:
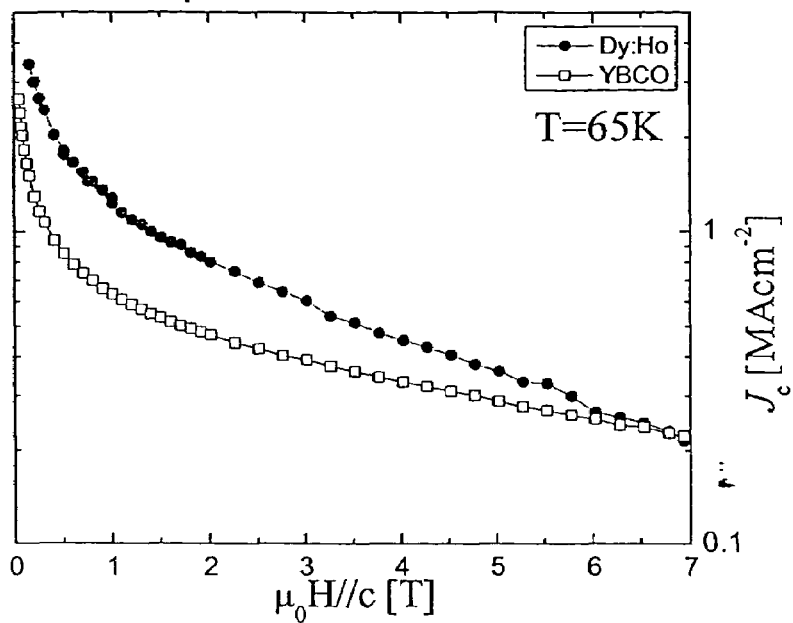
FIGS. 5(a) and 5(b) show a graph of $J_c$ as a function of field at both 75.5 K (4a) and 65 K (4b).
Figure 5:
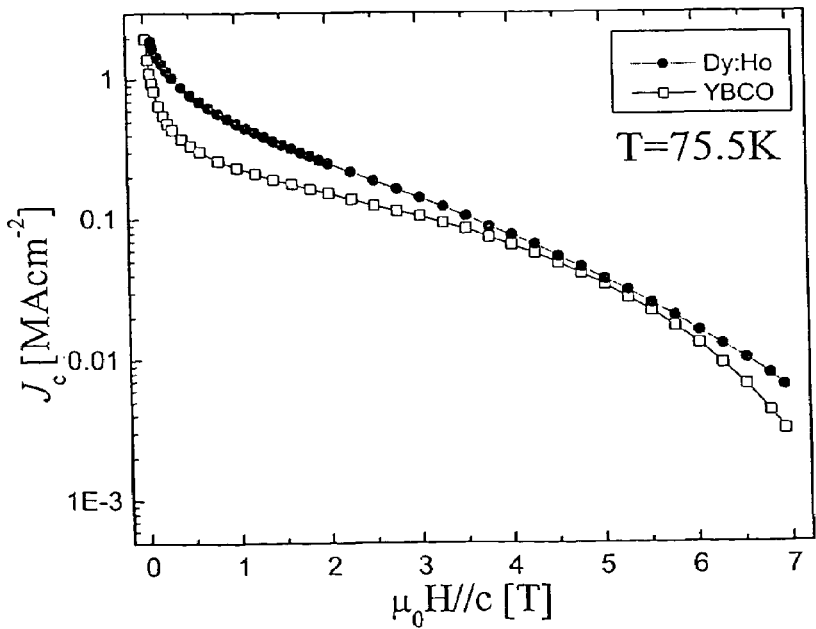

FIGS. 5(a) and 5(b) show that low ion size variance improve field dependence up to 6 T at 65 K and up to 4 T at 75.5 K. The value at 65 K is important as that temperature is under pumped liquid N$_2$, a temperature which many applications may be carried out at. In addition, the graph shows that as temperature is lowered, the variance effect becomes more pronounced. Hence, at 50 K, where some applications may be conducted, the variance effect will be very significant.

In summary, it has been shown that there is a strong systematic dependence of the low-field $J_c$ on RE ion size variance in mixed RE-123 films, where the average RE ionic radius is kept constant. At 0.2 T, samples with a nonzero variance on single crystal and IBAD-MgO substrates have consistently higher $J_c$'s than YBCO by a factor of 2. Also, while for YBCO, $J_c$ drops by a decade in 1 T, the optimum variance sample $J_c$ drops by a decade in >2.5 T. The optimum sample composition, Dy:Ho, has the lowest RE ion size variance.

Although the present invention has been described with reference to specific details, it is not intended that such details should be regarded as limitations upon the scope of the invention, except as and to the extent that they are included in the accompanying claims.

What is claimed is:

1. A thin film superconductive article comprising:
a substrate; and,
a thick film layer of a rare earth barium cuprate film comprised of $Dy_{0.25}Ho_{0.50}Y_{0.25}Ba_2Cu_3O_y$ upon the substrate, the $Dy_{0.25}Ho_{0.50}Y_{0.25}Ba_2Cu_3O_y$ film having a thickness of greater than about 600 nm and yielding a superconductive composition where ion size variance between the two or more rare earth metals is characterized as greater than zero and less than about $0.5\times10^{-4}$, wherein the rare earth barium cuprate film is further characterized as having an enhanced critical current density in comparison to a standard $YBa_2Cu_3O_y$ composition under identical testing conditions.

2. A thin film superconductive article comprising:
a substrate; and,
a thick film layer of rare earth barium cuprate film comprised of $Dy_{0.3}Ho_{0.55}Y_{0.15}Ba_2Cu_3O_y$ upon the substrate, the $Dy_{0.3}Ho_{0.55}Y_{0.15}Ba_2Cu_3O_y$ film having a thickness of greater than about 600 nm and yielding a superconductive composition where ion size variance between the two or more rare earth metals is characterized as greater than zero and less than about $10\times10^{-4}$, wherein the rare earth barium cuprate film including two or more rare earth metals is further characterized as having an enhanced critical current density in comparison to a standard $YBa_2Cu_3O_y$ composition under identical testing conditions.

3. A thin film superconductive article comprising:
a substrate; and,
a thick film layer of rare earth barium cuprate film comprised of $Dy_{0.42}Ho_{0.24}Y_{0.2}Er_{0.16}Ba_2Cu_3O_y$ upon the substrate, the $Dy_{0.42}Ho_{0.24}Y_{0.2}Er_{0.16}Ba_2Cu_3O_y$ film having a thickness of greater than about 600 nm and yielding a superconductive composition where ion size variance between the two or more rare earth metals is characterized as greater than zero and less than about $10\times10^{-4}$, wherein the rare earth barium cuprate film including two or more rare earth metals is further characterized as having an enhanced critical current density in comparison to a standard $YBa_2Cu_3O_y$ composition under identical testing conditions.

4. A thin film superconductive article comprising:
substrate; and,
a thick film layer of rare earth barium cuprate film comprised of $Y_{0.29}Gd_{0.09}Dy_{0.62}Ba_2Cu_3O_y$ upon the substrate, the $Y_{0.29}Gd_{0.09}Dy_{0.62}Ba_2Cu_3O_y$ film having a thickness of greater than about 600 nm and yielding a superconductive composition where ion size variance between the two or more rare earth metals is characterized as greater than zero and less than about $10\times10^{-4}$, wherein the rare earth barium cuprate film including two or more rare earth metals is further characterized as having an enhanced critical current density in comparison to a standard $Yba_2Cu_3O_y$ composition under identical testing conditions.

5. A thin film superconductive article of comprising:
a substrate; and,
a thick film layer of rare earth barium cuprate film comprised of $Y_{0.13}Gd_{0.04}Dy_{0.83}Ba_2Cu_3O_y$ upon the substrate, the $Y_{0.13}Gd_{0.04}Dy_{0.83}Ba_2Cu_3O_y$ film having a thickness of greater than about 600 nm and yielding a superconductive composition where ion size variance between the two or more rare earth metals is characterized as greater than zero and less than about $10\times10^{-4}$, wherein the rare earth barium cuprate film including two or more rare earth metals is further characterized as having an enhanced critical current density in comparison to a standard $Yba_2Cu_3O_y$ composition under identical testing conditions.

6. A thin film superconductive The article comprising:
a substrate; and,
a thick film layer of rare earth barium cuprate film comprised of $Dy_{0.42}Ho_{0.24}Y_{0.2}Er_{0.16}Ba_2Cu_3O_y$ upon the substrate, the $Dy_{0.42}Ho_{0.24}Y_{0.2}Er_{0.16}Ba_2Cu_3O_y$ film yielding a superconductive composition where ion size variance between the two or more rare earth metals is characterized as greater than zero and less than about $0.5\times10^{-4}$, wherein the rare earth barium cuprate film including two or more rare earth metals is further characterized as having an enhanced critical current density in comparison to a standard $YBa_2Cu_3O_y$ composition under identical testing conditions.

7. A thin film superconductive article comprising:
a substrate; and,
a thick film layer of rare earth barium cuprate film comprised of $Y_{0.13}Gd_{0.04}Dy_{0.83}Ba_2Cu_3O_y$ upon the substrate, the $Y_{0.13}Gd_{0.04}Dy_{0.83}Ba_2Cu_3O_y$ film yielding a superconductive composition where ion size variance between the two or more rare earth metals is characterized as greater than zero and less than about $0.5\times10^{-4}$, wherein the rare earth barium cuprate film including two or more rare earth metals is further characterized as having an enhanced critical current density in comparison to a standard $YBa_2Cu_3O_y$ composition under identical testing conditions.

* * * * *